United States Patent [19]
Yanagimachi et al.

[11] Patent Number: 5,888,298
[45] Date of Patent: Mar. 30, 1999

[54] MEMBER-HANDLING MECHANISM, AND MEMBER-HANDLING JIG FOR A CRYSTAL PULLING APPARATUS

[75] Inventors: Takahiro Yanagimachi; Satoshi Soeta, both of Takefu, Japan; Atsushi Iwasaki, Vancouver, Wash.; Shinobu Takeyasu, Urawa, Japan

[73] Assignee: Shin-Etsu Handotai Co., Ltd., Tokyo, Japan

[21] Appl. No.: 759,223

[22] Filed: Dec. 5, 1996

[30] Foreign Application Priority Data

Dec. 26, 1995 [JP] Japan ..................................... 7-350721

[51] Int. Cl.⁶ .................................................. C30B 35/00
[52] U.S. Cl. .......................... 117/200; 117/201; 117/202; 117/218; 117/911
[58] Field of Search ..................................... 117/200, 201, 117/202, 218, 900, 911

[56] References Cited

U.S. PATENT DOCUMENTS

| | | | |
|---|---|---|---|
| 4,175,610 | 11/1979 | Zauhar et al. | 164/122.2 |
| 4,454,096 | 6/1984 | Lorenzini et al. | 117/213 |
| 4,523,972 | 6/1985 | Cushman et al. | 414/225 |
| 5,407,181 | 4/1995 | Ohsawa | 266/257 |
| 5,429,341 | 7/1995 | Barczy et al. | 117/901 |
| 5,690,734 | 11/1997 | Imaeda et al. | 117/18 |

FOREIGN PATENT DOCUMENTS 2745247  4/1979  Germany.

*Primary Examiner*—Felisa Garrett
*Attorney, Agent, or Firm*—Oliff & Berridge, PLC

[57] ABSTRACT

A method, mechanisms and jig for handling a member of a crystal pulling apparatus are disclosed. The crystal pulling apparatus grows a single crystal from a melt of a crystalline material by a CZ method. Handling of a graphite crucible or the like of the crystal pulling apparatus, including a vertical moving operation, a swinging operation, or the like, is performed using a crane and a lifting jig. This makes it possible to readily move the member of the crystal pulling apparatus vertically and otherwise without relying on manual labor.

12 Claims, 3 Drawing Sheets

5,888,298

MEMBER-HANDLING MECHANISM, AND MEMBER-HANDLING JIG FOR A CRYSTAL PULLING APPARATUS

BACKGROUND OF THE INVENTION

1. Field of the Invention

The present invention relates to a method of handling, for example, moving vertically and otherwise, a relevant member of a crystal pulling apparatus used for pulling a seed crystal from a melt of a polycrystalline material to thereby obtain a single crystal. The present invention also relates to a mechanism for performing the method and a jig used in the method and mechanism.

2. Description of the Related Art

Conventionally, a pulling method (Czochralski method, hereinafter called the "CZ" method) and a floating zone method have been known as methods for obtaining a single crystal from a polycrystalline material such as silicon. In the CZ method, a polycrystalline material is first melted, and a seed crystal is pulled upwardly from the melt of the polycrystalline material. In this method, a shaft or a cable is employed to pull the seed crystal.

FIG. 4 shows an example of a conventional crystal pulling apparatus employing a cable. As shown in FIG. 4, the crystal pulling apparatus 100 includes a chamber 101, a crucible 102 disposed within the chamber 101, a heater 105 disposed around the crucible 102, a crucible holding shaft 107 and a rotating mechanism 108 for rotating the crucible 102, a seed chuck 111 for holding a seed crystal S of silicon, a cable 110 for pulling the seed chuck 111, and a winding mechanism 109 for rotating and winding up the cable 110.

The above-described chamber 101 includes a disk-shaped base plate 101B, a main chamber 101M which accommodates the crucible 102 and the like, a top plate 101T which serves as the ceiling portion of the main chamber 101M and a pull chamber 101P which is connected to the top plate 101T and through which the cable 110 is wound up and a single crystal is pulled.

The crucible 102 is composed of a quartz crucible 103 for accommodating a melt L therein, and a graphite crucible 104 which surrounds the quartz crucible 103. The heater 105 is a tubular member made of graphite, and is disposed so as to surround the crucible 102. The heater 105 has many slits which alternately extend from both axial ends of the heater 105. A heat-insulating cylinder 106 formed of a graphite material is disposed around the outer circumference of the heater 105.

Next, a description will be given of a method for growing a single crystal using the above-described crystal pulling apparatus 100.

First, a highly purified polycrystalline material of silicon is heated to a temperature higher than its melting point (about 1400° C.) so as to be melted. Subsequently, the cable 110 is released out such that the tip of the seed crystal S comes into contact with or is dipped into the surface of the melt L at the substantially central portion thereof. The crucible holding shaft 107 is then rotated in a desired direction, and the cable 110 is wound up while being rotated, so as to pull the seed crystal S. In this manner, the operation for growing a single crystal is started. Subsequently, this operation is continued while the pulling speed and the temperature are properly adjusted, so that a single crystal ingot C having a generally cylindrical shape is obtained.

However, recently, the diameter of a single crystal which is grown by the above-described conventional crystal pulling apparatus has tended to increase. This tendency is accompanied by an increase in the size of a graphite crucible and other relevant graphite members, resulting in an increase in the weight thereof Conventionally, a graphite member is brought into or removed from the chamber of a crystal pulling apparatus by physical labor performed by a worker (s). However, the above-mentioned tendency toward larger graphite members requires more workers to attend to the handling of the members. Also, a heavier weight and high-temperature heat impose a greater physical burden on workers, and because of graphite being fragile, there is a higher risk of breakage of the members caused by a shock imposed thereon or as a result of their being dropped, while they are being handled.

SUMMARY OF THE INVENTION

The present invention has been accomplished to solve the above-mentioned problems, and it is an object of the invention to provide a method of handling a relevant member of a crystal pulling apparatus for readily moving the relevant member vertically and otherwise without relying on manual labor to be performed by a worker(s). Another object of the present invention is to provide a mechanism for performing the method, and a jig used in the method and mechanism.

The present invention provides a member-handling method for a crystal pulling apparatus which grows a single crystal from a melt of a crystalline material by a pulling method. In the member-handling method, handing of a relevant member of the crystal pulling apparatus, including at least one of a vertical moving operation, a swinging operation and a horizontal moving operation, is performed by a mechanical handling mechanism.

The present invention provides a member-handling mechanism for a crystal pulling apparatus which includes a seed crystal that is vertically movable above a melt of a crystalline material, that is moved downward so as to contact the melt and is subsequently pulled upwardly so as to grow a single crystal of the crystalline material. The member-handling mechanism includes a drive unit which causes a handling operation, including at least one of a vertical moving operation, a swinging operation and a horizontal moving operation, to be performed on a relevant member used in the crystal pulling apparatus; a working portion which is driven by the drive unit and performs the handling operation; and a member-handling jig which is attached to the relevant member and connected to the working portion so as to transmit to the relevant member the handling operation performed by the working portion.

Preferably, in the member-handling mechanism for the crystal pulling apparatus, the working portion includes a chain or wire capable of vertically moving the member-handling jig, and the drive unit has a structure capable of winding up or releasing the chain or wire.

Preferably, the member-handling mechanism is used for a crystal pulling apparatus which includes at least one of a container for accommodating the crystalline material therein, a heating member for heating the container, a heat-insulating member for heat-insulating the container and heating member, and a gas flow guide member for guiding a gas toward the melt during growing of the single crystal. The member-handling mechanism handles at least one of the container, the heating member, the heat-insulating member, and the gas flow guide member.

Preferably, in the member-handling mechanism for the crystal pulling apparatus, at least one of the container, the heating member, the heat-insulating member, and the gas flow guide member is formed of a carbon material.

The present invention provides a member-handling jig used in a member-handling mechanism for a crystal pulling apparatus which comprises a seed crystal that is vertically movable above a melt of a crystalline material, that is moved downward so as to contact the melt and is subsequently pulled upwardly so as to grow a single crystal of the crystalline material. The member-handling mechanism comprises a drive unit for causing a handling operation, including at least one of a vertical moving operation, a swinging operation and a horizontal moving operation, to be performed on a relevant member used in the crystal pulling apparatus, and a working portion which is driven by the drive unit and performs the handling operation. The member-handling jig comprises an attachment portion which is attached to the relevant member, and a connection portion which is combined with the attachment portion and is connected to the working portion to thereby be subjected to handling, including at least one of a vertical moving operation, a swinging operation, or horizontal moving operation, to be performed by the working portion.

Preferably, in the member-handling jig for the crystal pulling apparatus, the attachment portion includes at least two anchorage portions which are anchored into the surface of the relevant member.

Preferably, in the member-handling jig for the crystal pulling apparatus, the attachment portion includes a support portion for supporting the bottom portion of the relevant member.

Preferably, in the member-handling jig for the crystal pulling apparatus, at least the attachment portion is formed of a heat resistant material.

As described above, through use of the member-handling method, member-handling mechanism, and member-handling jig for a crystal pulling apparatus according to the present invention, a relevant member having a heavy weight and/or a high temperature used in the crystal pulling apparatus can be readily handled, for example, moved vertically, swung, or moved horizontally, by means of a mechanical mechanism without relying on manual labor to be performed by a worker(s).

DESCRIPTION OF THE PREFERRED EMBODIMENTS

Embodiments of the present invention will now be described in detail with reference to the drawings.

Figure 1A:
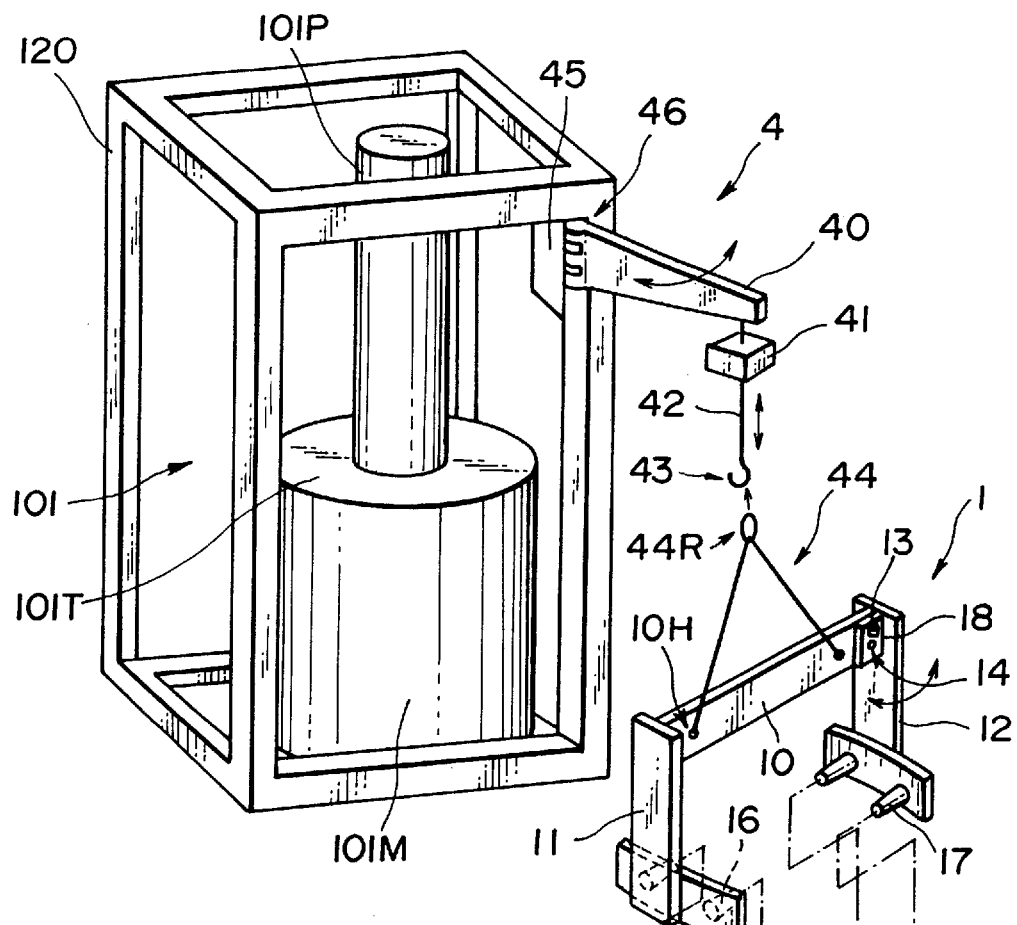
FIG. 1A is a perspective view showing the entire structure of a first embodiment of a member-handling mechanism for a crystal pulling apparatus according to the present invention.
Figure 1B:
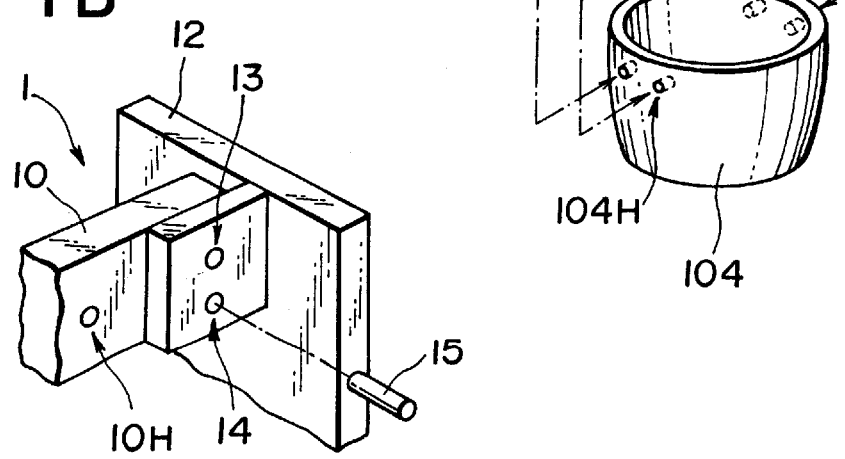
FIG. 1B is a perspective view showing the detailed structure of part of a lifting jig shown in FIG. 1A.

FIGS. 1A and 1B show the structure of a first embodiment of a member-handling mechanism for a crystal pulling apparatus according to the present invention, wherein FIG. 1A shows the entire structure, and FIG. 1B shows the detailed structure of part of a lifting jig 1.

As shown in FIG. 1A, the member-handling mechanism for a crystal pulling apparatus includes a crane apparatus 4, which is mounted to a frame 120 that surrounds a chamber 101 of the crystal pulling apparatus, and the lifting jig 1.

The crane apparatus 4 includes a swing drive unit 45 mounted to the frame 120, an arm portion 40 which is swung by the swing drive unit 45, a hinge portion 46 which serves as the center of swing of the arm portion 40, a winding drive unit 41 attached to the tip end of the arm portion 40, a winding chain 42 which is wound up or released by the winding drive unit 41, a hook 43 attached to the lower end of the winding chain 42, and a lifting chain 44. The winding drive unit 41 includes a drive source (not illustrated) such as an electric motor, a speed-reducing mechanism (not illustrated) such as a gear box, a driving-direction-switching mechanism, and a mechanism (not illustrated) such as a drum for winding up or releasing the chain 42. The swing drive unit 45 includes a drive source (not illustrated) such as an electric motor (not illustrated), a speed-reducing mechanism (not illustrated) such as a gear box, and a driving-direction-switching mechanism. A control box (not illustrated) having an ON/OFF switch and buttons for switching the driving direction and for controlling the speed and the like, is provided for each of the winding drive unit 41 and the swing drive unit 45. Also, the lifting chain 44 has a lifting ring 44R.

When a relevant member to be lifted is not so large and is relatively light, and thus a relatively small-sized lifting apparatus is used, the swing drive unit 45 is not necessarily provided because a lifted relevant member can be manually swung with ease.

As shown in FIGS. 1A and 1B, the lifting jig 1 includes a horizontal member 10, a stationary vertical member 11 attached to one end of the horizontal member 10, a movable vertical member 12 attached to the other end of the horizontal member 10, a hinge portion 13 which movably supports the movable vertical member 12, and a stopper hole 14 for fixing the movable vertical member 12.

The above-described horizontal member 10 has two chain attachment holes 10H, each located in the vicinity of a corresponding end of the horizontal member 10.

The stationary vertical member 11 is fixed to one end of the horizontal member 10. The movable vertical member 12 has an auxiliary plate 18 and is hinged to the other end of the horizontal member 10 by means of the hinge portion 13 formed in the auxiliary plate 18.

The stopper hole 14 is formed through the auxiliary plate 18 and the horizontal member 10. A stopper pin 15 is inserted into the stopper hole 14 to thereby prevent the movable vertical member 12 from rotating about the hinge portion 13 and thus from opening outward.

The stationary vertical member 11 and the movable vertical member 12 have two engagement pins 16 and two engagement pins 17, respectively, which project inward such that they face each other.

Four pin holes 104H are formed in the outer surface of a graphite crucible 104 of a crystal pulling apparatus 100 such that two of the four pin holes 104H are opposed to the remaining two, and such that they can engage the above-described engagement pins 16 and 17.

According to the above-described structure, the graphite crucible 104 is lifted in the following manner. The stopper pin 15 is removed from the stopper hole 14 to make the movable vertical member 12 ready for rotating about the hinge portion 13, and then the movable vertical member 12 is swung open outward. Next, the engagement pins 16 and 16 of the stationary vertical member 11 are fit into the corresponding pair of pin holes 104H and 104H in the graphite crucible 104. Then, the movable vertical member 12 is swung inward so as to fit the engagement pins 17 and 17 into the other pair of pin holes 104H and 104H in the graphite crucible 104. Then, the stopper pin 15 is inserted into the stopper hole 14 to thereby secure the movable vertical member 12.

Subsequently, the chain 44 is attached to the chain attachment holes 10H and 10H of the horizontal member 10, the hook 43 of the crane apparatus 4 is hooked into the lifting ring 44R of the chain 44, and then the winding drive unit 41 is started to raise the chain 44, thereby lifting the graphite crucible 104.

Next, the swing drive unit 45 is started to swing the arm portion 40, thereby swinging the graphite crucible 104 in a required direction. Thus, after a pull chamber 101P and a top plate 101T are removed, these lifting and swinging operations are combined so as to install the graphite crucible 104 within the main chamber 101M or to remove the graphite crucible 104 from the main chamber 101M.

As described above, the lifting jig 1 is used to handle the graphite crucible 104 through, for example, vertical movement. Since even after the operation of pulling a single crystal is completed, heat still remains in the graphite crucible 104 in many cases, at least the engagement pins 16 and 17, and the stationary and movable vertical members 11 and 12, which directly contact the graphite crucible 104, and preferably other portions of the lifting jig 1 as well, are formed of a heat resistant metallic material having sufficient strength such as stainless steel (SUS) or molybdenum.

Next will be described the structure and action of another embodiment of the present invention.

Figure 2:
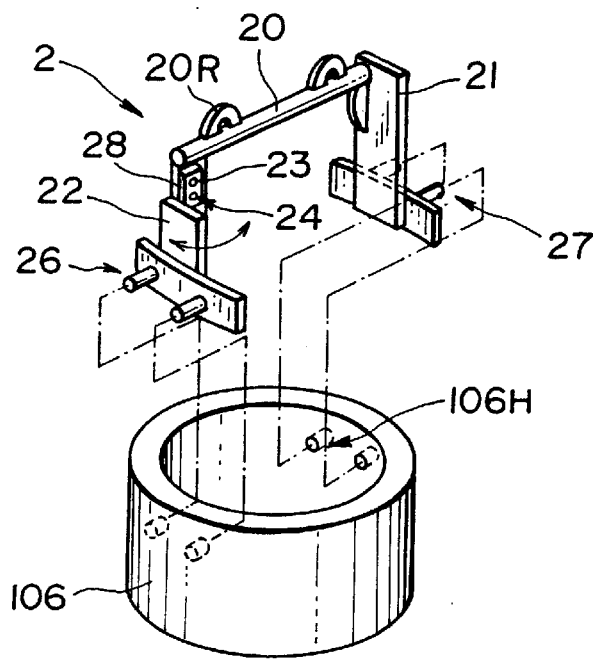
FIG. 2 is a perspective view showing the structure of a second embodiment of the member-handling mechanism for a crystal pulling apparatus according to the present invention.

FIG. 2 shows the structure of a lifting jig 2 in a second embodiment of the member-handling mechanism for a crystal pulling apparatus according to the present invention. A crane apparatus used in the present embodiment is the same as that shown in FIG. 1A.

As shown in FIG. 2, the lifting jig 2 includes a horizontal member 20, a stationary vertical member 21 attached to one end of the horizontal member 20, a movable vertical member 22 attached to the other end of the horizontal member 20, a hinge portion 23 which movably supports the movable vertical member 22, and a stopper hole 24 for securing the movable vertical member 22.

The above-described horizontal member 20 has two chain attachment rings 20R, each located in the vicinity of a corresponding end of the horizontal member 20.

The stationary vertical member 21 is fixed to one end of the horizontal member 20. The movable vertical member 22 has an auxiliary plate 28 as in the lifting jig 1 and is hinged to the other end of the horizontal member 20 by means of the hinge portion 23 formed in the auxiliary plate 28.

The stopper hole 24 is formed through the auxiliary plate 28 and the horizontal member 20. A stopper pin (not illustrated) is inserted into the stopper hole 24 to thereby prevent the movable vertical member 22 from rotating about the hinge portion 23 and thus from opening outward.

The stationary vertical member 21 and the movable vertical member 22 have two engagement pins 27 and two engagement pins 26, respectively, which project outward in opposed directions.

Four pin holes 106H are formed in the inner surface of a heat-insulating cylinder 106 of the crystal pulling apparatus 100 such that two of the four pin holes 106H are opposed to the remaining two, and such that they can engage the above-described engagement pins 26 and 27.

According to the above-described structure, the heat-insulating cylinder 106 is lifted in the following manner. The stopper pin (not illustrated) is removed from the stopper hole 24 to make the movable vertical member 22 ready for rotating about the hinge portion 23, and then the movable vertical member 22 is swung inward. Next, the lifting jig 2 is moved downward such that it is inserted into the heat-insulating cylinder 106 while the movable vertical member 22 is maintained in the inwardly-swung state. The engagement pins 27 and 27 of the stationary vertical member 21 are fit into the corresponding pair of pin holes 106H and 106H in the heat-insulating cylinder 106. Then, the movable vertical member 22 is swung outward so as to fit the engagement pins 26 and 26 into the other pair of pin holes 106H and 106H in the heat-insulating cylinder 106. Then, the stopper pin (not illustrated) is inserted into the stopper hole 24 to thereby secure the movable vertical member 22.

Subsequently, the chain 44 is attached to the chain attachment rings 20R and 20R, and the hook 43 of the crane apparatus 4 is hooked into the lifting ring 44R of the chain 44. As in the lifting jig 1 of the first embodiment, the lifting and swinging operations of the winding drive unit 41 and the swing drive unit 45 are combined so as to install the heat-insulating cylinder 106 within the main chamber 101M or to remove the heat-insulating cylinder 106 from the main chamber 101M.

As described above, the lifting jig 2 is used, for example, to vertically move the heat-insulating cylinder 106. Since even after the operation of pulling a single crystal is completed, heat still remains in the heat-insulating cylinder 106 in many cases, at least the engagement pins 26 and 27, and the stationary and movable vertical members 21 and 22, which directly contact the heat-insulating cylinder 106, and preferably other portions of the lifting jig 2 as well, are formed of a heat resistant metallic material having sufficient strength such as stainless steel (SUS) or molybdenum.

Next will be described the structure and action of still another embodiment of the present invention.

Figure 3:
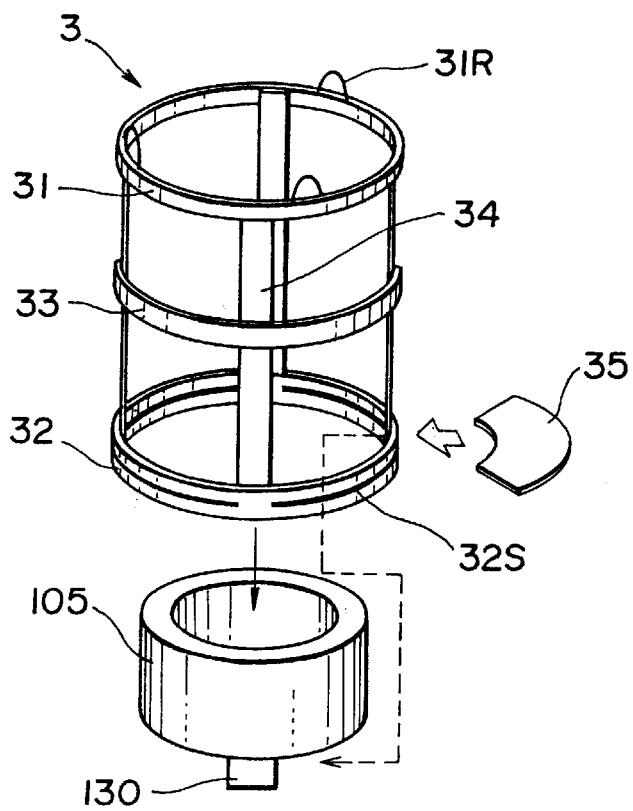
FIG. 3 is a perspective view showing the structure of a third embodiment of the member-handling mechanism for a crystal pulling apparatus according to the present invention.
Figure 4:
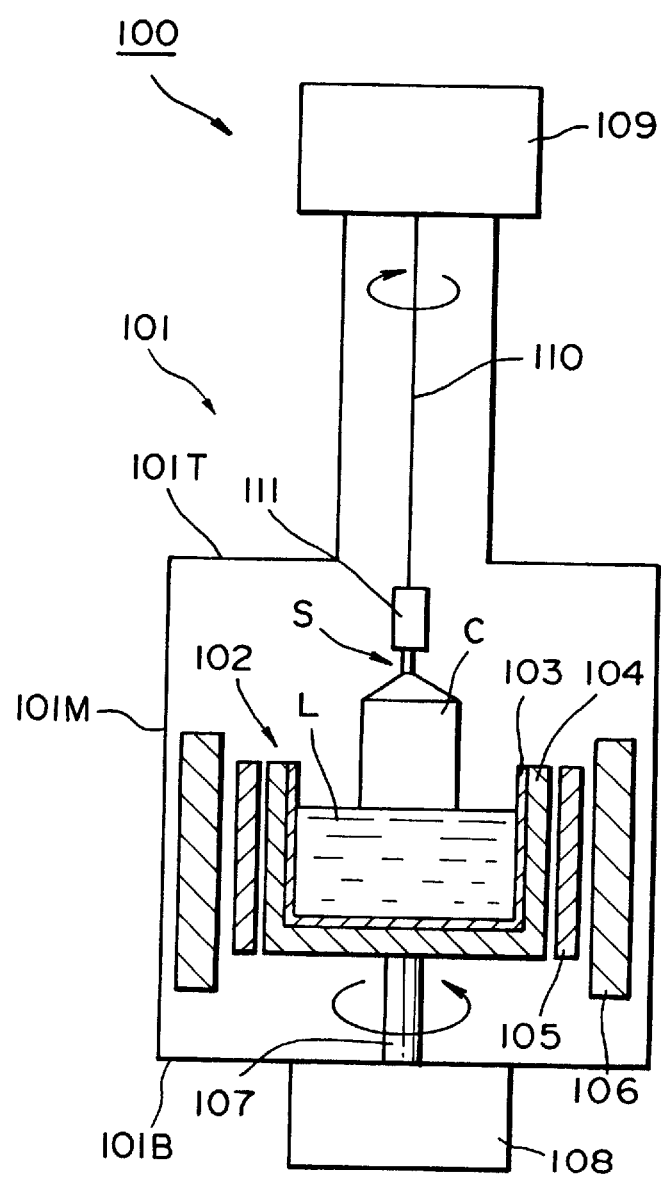
FIG. 4 is a sectional view showing the entire structure of a crystal pulling apparatus.

FIG. 3 shows the structure of a lifting jig 3 in a third embodiment of the member-handling mechanism for a crystal pulling apparatus according to the present invention.

As shown in FIG. 3, the lifting jig 3 includes an upper annular member 31, a lower annular member 32, an intermediate annular member 33 centrally located therebetween, vertical members 34, and bottom plates 35. Each of the annular members 31, 32, and 33 and each vertical member 34 are joined at an intersection thereof, thereby forming a cage which is open at the top and bottom thereof.

Three chain attachment rings 31R are provided at the top edge of the above-described upper annular member 31.

Horizontal slits 32S are formed in part of the lower annular member 32 so as to insert the bottom plates 35 thereinto to thereby hold the bottom plates 35 in place.

The cage, which has the above-described structure formed of the annular members 31, 32, and 33 and the vertical members 34, is placed from above the cylindrical heater 105 so as to cover the heater 105. Heater legs 130 for connection with electrodes are provided at the bottom portion of the heater 105. The height of the heater leg portion 130 is set to be greater than the height of the slit 32S above the bottom edge of the cage. The bottom plate 35 is inserted through the slit 32S so as to support the heater 105 thereon. The thus-caged heater 105 is supported by the bottom plate 35 and prevented from tilling down by the annular members 31, 32, and 33 and the vertical members 34.

Subsequently, the chain (not illustrated) is attached to the chain attachment rings 31R of the upper annular member 31, and the hook 43 of the crane apparatus 4 is hooked into the lifting ring (not illustrated) of the chain (not illustrated). As in the lifting jigs 1 and 2 of the first and second embodiments, respectively, the lifting and swinging operations of the winding drive unit 41 and the swing drive unit 45 are combined so as to install the heater 105 within the main chamber 101M or to remove the heater 105 from the main chamber 101M.

In this case, in distinction from the above-described first and second embodiments, the chain (not illustrated) is composed of three chain segments (not shown), whose ends are joined together so that the lifting ring (not illustrated) is attached to the joint portion.

As described above, the lifting jig 3 is used, for example, to vertically move the heater 105. Since even after the operation of pulling a single crystal is completed, heat still remains in the heater 105 in many cases, at least the bottom plate 35, which directly contacts the heater 105, and preferably other portions of the lifting jig 3 as well, are formed of a heat resistant metallic material having sufficient strength such as stainless steel (SUS) or molybdenum.

In the above-described embodiments, the lifting jigs 1, 2, and 3 serve as a member-handling jig. In the crystal pulling apparatus 100, the graphite crucible 104, the heat-insulating cylinder 106, and the heater 105 are relevant members to be handled; the graphite crucible 104 serves as a container; the heat-insulating cylinder 106 serves as a heat-insulating member; and the heater 105 serves as a heating member.

Also, the winding drive unit 41 and the swing drive unit 45 serve as a drive unit. The chain 42, the hook 43, and the arm portion 40 serve as a working portion.

The engagement pins 16 and 17 and the vertical members 11 and 12 in the lifting jig 1; the engagement pins 26 and 27 and the vertical members 21 and 22 in the lifting jig 2; and the bottom plate 35 in the lifting jig 3 serve as an attachment portion of the member-handling jig. The engagement pins 16 and 17 in the lifting jig 1 and the engagement pins 26 and 27 in the lifting jig 2 serve as an anchorage portion. The bottom plate 35 in the lifting jig 3 serves as a support portion.

The auxiliary plate 18, the stopper pin 15, the hinge portion 13, and the horizontal member 10 in the lifting jig 1; the auxiliary plate 28, the stopper pin (not illustrated), the hinge portion 23, the horizontal member 20, and the chain attachment ring 20R in the lifting jig 2; and the cage formed of the annular members 31, 32, and 33 and the vertical members 34 in the lifting jig 3; serve as a connection portion of the member-handling jig.

The present invention is not limited to the above-described embodiments. The above-described embodiments are mere examples, and those having the substantially same structure as that described in the appended claims and providing the similar action and effects are included in the scope of the present invention.

For example, the above embodiments are described while mentioning a semiconductor such as silicon as a material from which a single crystal is obtained. However, the present invention is not limited thereto, and other crystalline materials may be used.

In the above-described embodiments, the seed chuck, the crucible and the like are made of a carbon material such as graphite. However, the present invention is not limited thereto. The above-described parts may be made of other materials, provided that the materials can endure the high temperature of a melt, have sufficient strength to support the weight of a single crystal to be pulled, and have properties which neither introduce impurities into the melt or the single crystal nor cause harmful reaction. For example, molybdenum, tungsten and the like can be used among metallic materials, and carbon-based materials such as graphite and carbon-fiber-reinforced carbon composite materials and ceramics materials such as nitride ceramics and carbide ceramics may be used.

In the above-described embodiments, relevant members used in the crystal pulling apparatus refer to the graphite crucible, the heat-insulating cylinder, and the heater. However, the present invention is not limited thereto. The relevant members may include other members, for example, a gas flow guide member such as a gas flow guide cylinder for guiding a gas toward a melt while a single crystal is being pulled.

In the above-described embodiments, handling operations to be performed on relevant members refer to vertically moving operation and swinging operation. However, the present invention is not limited thereto. The handling operations may include other operations, for example, a linear move in a horizontal direction, a stoppage at a predetermined position, and a release from an attachment portion. The above-mentioned swinging operation includes a swing about a vertical axis (z-axis) and a swing about a horizontal axis (x-or y-axis). The above-mentioned handling operations may also include an appropriate combination of a vertical move, a swing, and a horizontal move; for example, a move in an oblique direction and a swing about an inclined axis.

In the above-described embodiments, a mechanical mechanism for handling relevant members refers to the mechanism which uses an electric motor as a drive source. However, the present invention is not limited thereto. Other mechanical mechanisms, for example, a mechanism using as a drive source an oil hydraulic cylinder or an oil hydraulic motor, may be used.

In the above-described embodiments, an attachment portion of the member-handling jig refers to the engagement pin or the like which serves as an anchorage portion and which is anchored into the surface of a relevant member in order to lift the relevant member, or to the bottom plate which serves as a support portion and which supports the bottom portion of a relevant member in order to lift the relevant member. However, the present invention is not limited thereto. An attachment portion having another structure, for example, a lifting ring or hole formed integrally with a relevant member may also be used.

In order to anchor the above-described anchorage portion into the surface of a relevant member to thereby lift the relevant member, the movable vertical member is provided only at one end of the horizontal member in the above-described first and second embodiments. However, the movable vertical member may be provided at both ends of the horizontal member.

In order to support the bottom portion of a relevant member by the above-described support portion to thereby lift the relevant member, the bottom plates are inserted into the slits in the above-described third embodiment However, the bottom plate may be fixed to the cylindrical body, and part of the side wall of the cylindrical body may be formed to function as a door which is hinged so as to be openable. In this case, after the door is opened, a relevant member is moved sideward to be placed on the bottom plate, and subsequently the door is closed, and then the relevant member is lifted. Alternatively, a tubular body having a bottom plate may be vertically divided into two pieces, which are hinged at one side edge and openably locked at the other side edge. In this case, a relevant member is lifted in the following procedure: the cylindrical body is unlocked to be opened, the relevant member is moved sideward to be placed on one piece of the halved bottom plate, the cylindrical body is closed and locked, and the relevant member is lifted.

In the above-described embodiments, the crane apparatus which uses the chain is employed. However, the present invention is not limited thereto. A crane apparatus which uses a wire may be employed.

What is claimed is:

1. A member-handling mechanism for use in a crystal pulling apparatus which comprises a seed crystal that is positionable above a melt of a crystalline material, moved downwardly so as to contact said melt and subsequently pulled upwardly so as to grow a single crystal of said crystalline material, said member-handling mechanism comprising:

a drive unit for causing a handling operation, including at least one of a vertical moving operation, a swinging operation and a horizontal moving operation, to be performed on a member used in said crystal pulling apparatus;

a working portion which is driven by said drive unit and performs said handling operation; and a member-handling jig which is attached to said member and connected to said working portion so as to transmit said handling operation performed by said working portion to said member.

2. A member-handling mechanism for a crystal pulling apparatus according to claim 1, wherein said working portion comprises a chain or wire for vertically moving said member-handling jig, and said drive unit winds up or releases said chain or wire.

3. A member-handling mechanism for a crystal pulling apparatus according to claim 2, wherein said crystal pulling apparatus comprises at least one of a container for containing said crystalline material, a heating member for heating said container, a heat-insulating member for heat-insulating said container and heating member, and a gas flow guide member for guiding a gas toward said melt during the growing of said single crystal; and said member-handling mechanism handles at least one of said container, said heating member, said heat-insulating member, and said gas flow guide member.

4. A member-handling mechanism for a crystal pulling apparatus according to claim 3, wherein at least one of said container, said heating member, said heat-insulating member, and said gas flow guide member is formed of a carbon material.

5. A member-handling mechanism for a crystal pulling apparatus according to claim 2, wherein said crystal pulling apparatus comprises at least one of a container for containing said crystalline material, a heating member for heating said container, a heat-insulating member for heat-insulating said container and heating member, and a gas flow guide member for guiding a gas toward said melt during the growing of said single crystal; and said member-handling mechanism handles at least one of said container, said heating member, said heat-insulating member, and said gas flow guide member.

6. A member-handling mechanism for a crystal pulling apparatus according to claim 5, wherein at least one of said container, said heating member, said heat-insulating member, and said gas flow guide member is formed of a carbon material.

7. A member-handling jig for use in a member-handling mechanism for a crystal pulling apparatus which comprises a seed crystal that is positionable above a melt of a crystalline material, moved downwardly so as to contact said melt and subsequently pulled upwardly so as to grow a single crystal of said crystalline material, said member-handling mechanism comprising a drive unit for causing a handling operation, including at least one of a vertical moving operation, a swinging operation and a horizontal moving operation, to be performed on a member used in said crystal pulling apparatus, and a working portion which is driven by said drive unit and performs said handling operation, said member-handling jig comprising:

an attachment portion which is attached to said member; and a connection portion which is attached to said attachment portion and is connected to said working portion, said connection portion and said attachment portion being subjected to the handling operation, including at least one of the vertical moving operation, the swinging operation and the horizontal moving operation, performed by said working portion.

8. A member-handling jig for a crystal pulling apparatus according to claim 7, wherein said attachment portion includes at least two anchorage portions which are anchored into a surface of said member.

9. A member-handling jig for a crystal pulling apparatus according to claim 7, wherein said attachment portion includes a support portion for supporting a bottom portion of said member.

10. A member-handling jig for a crystal pulling apparatus according to claim 7, wherein at least said attachment portion is formed of a heat resistant material.

11. A member-handling mechanism for use in a crystal pulling apparatus which comprises a seed crystal that is positionable above a melt of a crystalline material, moved downwardly so as to contact the melt and subsequently pulled upwardly so as to grow a single crystal of the crystalline material, the member-handling mechanism comprising:

means for grasping a member used to form a single crystal; and means for causing the member to undergo a mechanical handling operation, including machine-inducing at least one of a vertical moving operation, a swinging operation and a horizontal moving operation.

12. A method of operating a member-handling mechanism for use in a crystal pulling apparatus which comprises a seed crystal that is positionable above a melt of a crystalline material, moved downwardly so as to contact the melt and subsequently pulled upwardly so as to grow a single crystal of the crystalline material, the method comprising the steps of:

grasping a member used to form a single crystal; and causing the member to undergo a mechanical handling operation, including machine-inducing at least one of a vertical moving operation, a swinging operation and a horizontal moving operation.

* * * * *